US007472326B2

(12) United States Patent
Holmes

(10) Patent No.: US 7,472,326 B2
(45) Date of Patent: Dec. 30, 2008

(54) SEMICONDUCTOR TEST SYSTEM HAVING MULTITASKING ALGORITHMIC PATTERN GENERATOR

(75) Inventor: John M. Holmes, Campbell, CA (US)

(73) Assignee: Nextest Systems Corporation, San Jose, CA (US)

( * ) Notice: Subject to any disclaimer, the term of this patent is extended or adjusted under 35 U.S.C. 154(b) by 832 days.

(21) Appl. No.: 10/431,043

(22) Filed: May 6, 2003

(65) Prior Publication Data

US 2004/0153920 A1    Aug. 5, 2004

Related U.S. Application Data

(60) Provisional application No. 60/378,488, filed on May 6, 2002.

(51) Int. Cl.
*G01R 31/28* (2006.01)
(52) U.S. Cl. ........................................ 714/738; 714/728
(58) Field of Classification Search ................. 714/724, 714/728, 731, 738, 739, 744
See application file for complete search history.

(56) References Cited

U.S. PATENT DOCUMENTS

| 4,759,021 A | * | 7/1988 | Kawaguchi et al. ......... 714/743 |
| 4,862,460 A | * | 8/1989 | Yamaguchi ................ 714/743 |
| 4,905,183 A | * | 2/1990 | Kawaguchi et al. .......... 712/19 |
| 5,349,587 A | * | 9/1994 | Nadeau-Dostie et al. .... 714/729 |
| 5,572,666 A | | 11/1996 | Whitman |
| 5,883,905 A | * | 3/1999 | Eastburn ................... 714/738 |
| 6,006,350 A | * | 12/1999 | Tsujii ....................... 714/738 |
| 6,118,304 A | | 9/2000 | Potter et al. |
| 6,243,665 B1 | | 6/2001 | Nagoya et al. |
| 6,246,250 B1 | | 6/2001 | Doherty et al. |
| 6,314,034 B1 | * | 11/2001 | Sugamori ................... 365/201 |
| 6,363,510 B1 | | 3/2002 | Rhodes et al. |
| 6,571,365 B1 | | 5/2003 | Rhodes et al. |
| 6,631,340 B2 | * | 10/2003 | Sugamori et al. .......... 702/122 |
| 6,754,868 B2 | * | 6/2004 | Bristow et al. ............. 714/744 |

FOREIGN PATENT DOCUMENTS

| JP | 63036163 A | * | 2/1988 |
| JP | 07198798 A | * | 8/1995 |

OTHER PUBLICATIONS

"Practical Test Methods for Verification of the EDRAM" by Stalnaker, K. International Test Conference Proceedings, Publication Date: Oct. 2-6, 1994 p. 362 Inspec Accession No. 4846995.*

* cited by examiner

*Primary Examiner*—Cynthia Britt
(74) *Attorney, Agent, or Firm*—Dorsey & Whitney LLP

(57) ABSTRACT

A tester and method are provided for testing semiconductor devices. Generally, the tester includes a multitasking Algorithmic Pattern Generator (APG) to concurrently execute multiple programs on multiple test sites using a single pattern generator. In one embodiment, up to eight test programs are run independently and concurrently on eight independent sixteen-pin devices on a 128 pin test site. When the multitasking APG is ready to broadcast to a device, timing system associated with that device only (and not the other devices) are loaded. While the timing system is executing the cycle of the test programs for the device just loaded, the APG continues on to load the other devices. Because of the slow cycle rates required for programming versus reading, the tester is particularly advantageous for testing flash memory. Optionally, for higher throughput, the APG can be run in lock step at up to a maximum operating frequency of the APG during read cycle of flash.

17 Claims, 4 Drawing Sheets

SEMICONDUCTOR TEST SYSTEM HAVING MULTITASKING ALGORITHMIC PATTERN GENERATOR

REFERENCE TO RELATED APPLICATIONS

This application claims priority to U.S. Provisional Application Ser. No. 60/378,488, entitled Multitasking Algorithmic Pattern Generator, filed May 6, 2002, the entire contents of which is incorporated herein by reference.

FIELD OF THE INVENTION

The present invention relates generally to a system for testing integrated circuits (ICs), and, more particularly, to a method and apparatus for high speed testing of ICs having memory arrays.

BACKGROUND OF THE INVENTION

Manufacturers in the electronics industry use test systems or testers to automatically test various electronic components and integrated circuits (ICs) to weed out defective devices or ICs. Broadly, there are two types of digital testers, those suitable for testing memory arrays or circuits, such as flash memory or Random Access Memories (RAM), and those suitable for testing logic circuits, such as Micro Controllers, Application Specific ICs (ASICs), and Programmable Logic Devices (PLDs). Generally, it is desirable to test ICs at several points during the manufacturing process including while they are still part of a wafer or substrate and after packaging the devices but before they are mounted or assembled on modules, cards or boards. This repetitive testing imposes demands on testers to automatically perform tests at high speed and with a high degree of accuracy. Moreover, the trend in the electronics industry has been to further increase the miniaturization of electronic devices and circuits, thereby allowing for an increase in the complexity of ICs. Thus, as ICs become more complex, the complexity of the testers must increase correspondingly.

To test the functionality of an IC, data patterns are delivered to the Device Under Test (DUT) with specific timing and voltage settings through timing generators and pin electronic channels, then data is read from the DUT with specific timing and voltage settings to ensure that the DUT responds correctly. A comparator in pin electronics channels compares the DUT output signal with an expected output signal, and couples results of the comparison back to an error capture memory.

For testing logic DUTs, data patterns are typically stored in large semiconductor memories inside the tester. For memory testing, data patterns are typically far too lengthy to store in the tester. Because of the regular array structure of a memory DUT, data patterns can be generated algorithmically using a specially built computer commonly known as an Algorithmic Pattern Generator (APG). This technique has been in practice for many years and is the industry standard method of generating memory test data patterns.

The testing of flash memory DUTs presents a unique set of challenges compared to testing of other types of memory devices. Flash memories are programmable devices that may require different programming times and voltages on each cell on each device. Since the programming is done through the Algorithmic Pattern Generator, it is currently believed that the highest throughput can be obtained when each DUT has its own APG.

Many prior art memory testers have had one APG that is fanned out to numerous timing generators and pin electronic channels to simultaneously test a number of DUTs. When flash memories are tested using this methodology, test time increases enormously because flash memories program at a very slow rate compared to their read cycle, and all DUTs must wait for the slowest DUT to finish programming before the APG can proceed. Thus, during programming the APG typically runs at a slow cycle rate decreasing the efficiency and utilization of tester resources. Dedicated conventional flash memory testers have attempted to deal with this problem by putting more APGs in the tester to give independence to each DUT.

Flash DUTs containing a small number of physical pins with many signals multiplexed onto those pins are becoming much more common. An example of such a flash DUT is a NAND flash DUT that typically has 16 pins. A more extreme example of a small pincount programmable memory is a serial EEPROM that has only 4 signal pins. Production of these DUTs is cost sensitive and can only support the use of very low cost testers. However, increasing the number of APGs in a tester to provide increased independence per DUT raises the cost of the tester prohibitively. Thus, increasing the number of APGs is not a wholly satisfactory solution.

Accordingly, there is a need for a tester and method of using the same that increases the efficiency and utilization of tester resources by maximizing use of the APG. There is a further need for a tester and method that increases the efficiency per DUT when independently testing multiple DUTs, and is also capable of testing multiple DUTs in lock step at the full cycle rate of the APG, for example during read cycle of flash DUTs.

The system and method of the present invention provides these and other advantages over the prior art.

SUMMARY

The present invention is directed to an apparatus and method for high speed testing of ICs having memory arrays.

According to one aspect of the present invention, a semiconductor test apparatus or tester is provided for testing semiconductor devices. Generally, the tester includes a multitasking Algorithmic Pattern Generator (APG). The multitasking capability allows the APG to concurrently execute multiple programs on a single pattern generator. In one embodiment, the multitasking APG is time-sliced up to eight ways, allowing up to eight test programs to run independently and concurrently on eight independent sixteen-pin DUT on a 128 pin test site using a single APG. The multitasking increases the efficiency and utilization of tester resources by eliminating dead cycles in pattern execution by servicing each DUT independently so that no DUT waits on another DUT to finish an operation before proceeding in the pattern.

In another aspect, the present invention is directed to a method of testing a DUT using an apparatus or tester having a multitasking APG.

In yet another aspect, the present invention is directed to semiconductor device tested using an apparatus or tester having a multitasking APG according to the method of the invention.

BRIEF DESCRIPTION OF THE DRAWINGS

These and various other features and advantages of the present invention will be apparent upon reading of the following detailed description in conjunction with the accompanying drawings, where.

DETAILED DESCRIPTION

Figure 1:
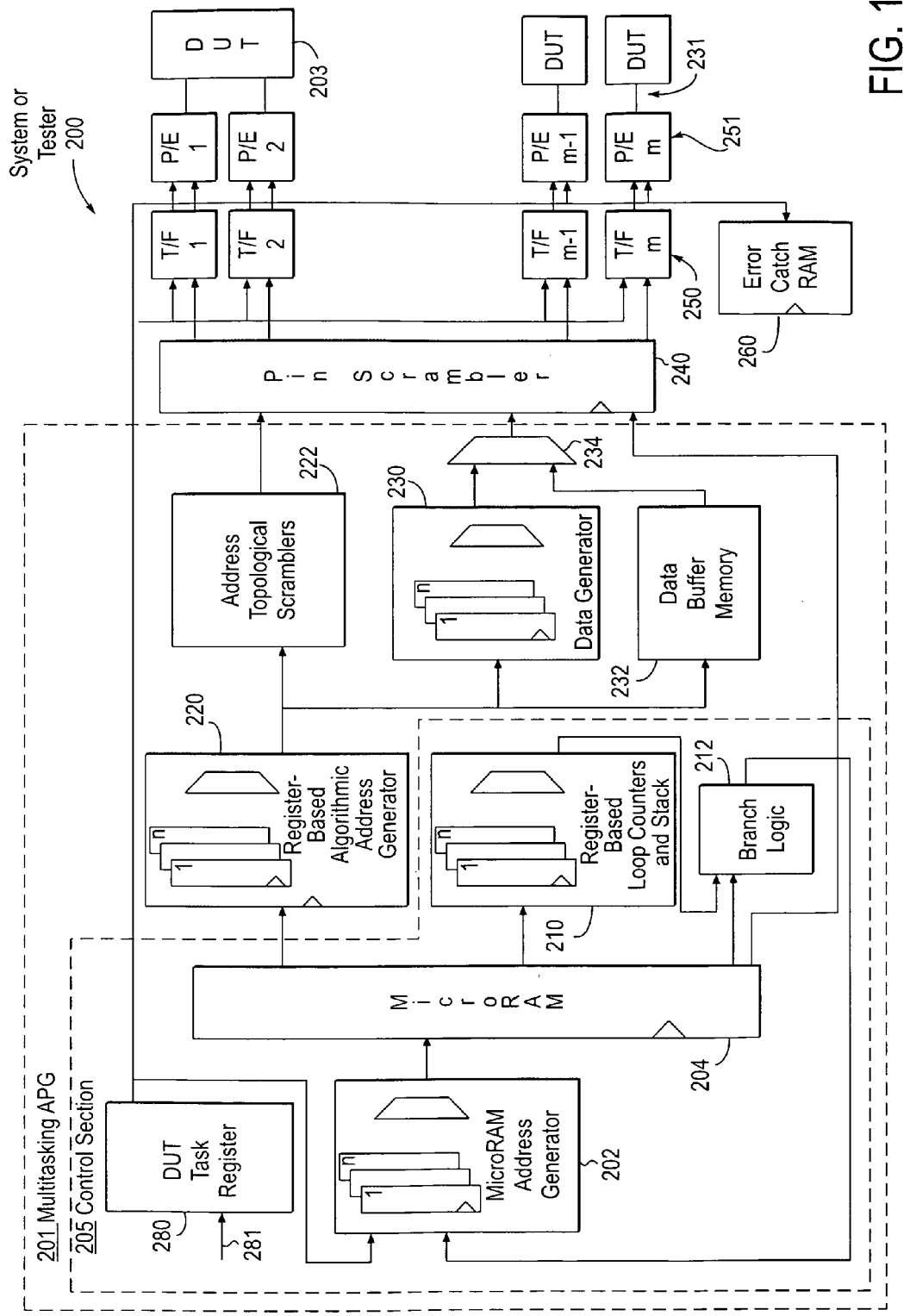
FIG. 1 is a register level block diagram of a tester for testing integrated circuits having a multitasking Algorithmic Pattern Generator according to an embodiment of the present invention.

The present invention is directed to a system and method for efficient and high speed testing of Integrated Circuits (ICs) using a tester having a multitasking Algorithmic Pattern Generator (APG).

A test system or tester 200 having a multitasking APG 201 for testing one or more devices under test (DUT 203) according to an embodiment of the present invention will now be described with reference to FIG. 1. By DUT 203 it is meant any electronic component module or an IC having logic circuits, memory arrays or both. DUT 203 can be, for example, a die, packaged or can be one of a number of devices on a substrate. DUT 203 can be coupled to test system 200 via a number of pin 231 or via probes (not shown) contacting pads on the substrate (not shown). While only one DUT is shown, it will be appreciated that test system 200 can and preferably include a number of test sites sufficiently large for parallel testing of multiple DUTs 203.

For purposes of clarity, many of the details of testers that are widely known and are not relevant to the present invention have been omitted. Testers are described in more detail, for example, in commonly assigned, co-pending U.S. patent application Ser. No. 09/895,439, filed 29 Jun. 2001 and entitled Semiconductor Test System Having Double Data Rate Pin Scrambling; U.S. patent application Ser. No. 10/039,738, filed 4 Jan. 2002 and entitled An Apparatus Having Pattern Scrambler For Testing A Semiconductor Device And Method For Operating Same; and U.S. patent application Ser. No. 10/170,916, filed 12 Jun. 2002 and entitled Stackable Semiconductor Test System And Method For Operating Same, the entire contents of each of which is incorporated herein by reference.

Referring to FIG. 1, the tester 200 generally includes, in addition to the multitasking APG 201, a pin scrambler 240, a number of timing generators and format circuits (T/Fs 250), and a number of pin electronic (PE) circuits or channels 251, and coupled between the T/Fs and the pins 231 of the DUTs 203. A test site computer (not shown) and a clock couples to every other component or element in the multitasking APG 201, the pin scrambler 240 and T/Fs 250 for providing a timing or clock signal having a clock cycle and controlling the operation thereof.

The pin scrambling circuit 240 couples any one of a number of outputs of the multitasking APG 201 to any one of the T/Fs 250, and through the T/F to any one of the pins 231 on any one of the DUTs 203. The function of the Pin Scrambler 240 is to allow any one of the pins 231 of the DUT 203 to be driven from any pattern source in the APG 201 on each clock cycle. In addition, the outputs of the multitasking APG 201 coupled to each pin 231 of the DUT 203 can be decided or selected on a cycle-by-cycle basis. Thus, the test signal or pattern out of the multitasking APG 201 can coupled to a particular pin 231 on a particular DUT 203, and can be switched or changed "on the fly" without rewiring of the connection to the DUT or extensive reprogramming of the multitasking APG 201. In the tester 200 shown in FIG. 1, the Pin Scrambler 240 is controlled by the multitasking APG 201 (control connections not shown) and can be designed, for example, to allow 64 different pattern mappings on each pin 231 of the DUT 203 on a cycle-by-cycle basis. Testers 200 having a pin scrambler 240, are commercially available from Nextest Systems Inc., of San Jose, Calif., and are described in more detail, for example, in commonly assigned, co-pending U.S. patent application Ser. No. 09/895,439.

The T/Fs 250 adjust the timing and formatting of various signals of the test pattern, i.e., drive/expect data signal, strobe control signal and an Input/Output (I/O) control signal, received from the multitasking APG 201 and couple the output from the multitasking APG to the DUTs 203, through the PE channels 251.

Each PE channel 251 typically receives a 3-bit portion of the test pattern or signal from the multitasking APG 201 through the T/Fs 250, each 3-bit signal including the drive/expect data signal, strobe control signal and I/O control signal. Some test systems decode these (typically) three bits into a different combination of eight PE control functions. Each PE channel 251 typically includes a PE driver (not shown) capable of coupling signals to a pin 231 of DUT 203, a comparator (not shown) for comparing an output signal with an expected output signal, and an error logic circuit (not shown) for coupling results of the comparison back through the multitasking APG 201 to an error catch RAM 260. Generally, PE driver and comparator are not active in the same PE channel 251 at the same time, since pin 231 is either receiving data or control signals or transmitting a result at a given time.

The multitasking APG 201 includes a control section 205, a register-based algorithmic Address Generator 220, an Address Topological Scrambler 222, a Data Generator 230, and a data multiplexer 234. The multitasking APG 201 has the ability to generate data patterns on every clock cycle of operation with no "dead cycles", a dead cycle being one in which the multitasking APG computes but no data is generated for the DUT 203. Having no dead cycles in a data pattern means that the DUT 203 receives the most stringent test because it gets exercised at its toughest timing limits. A dead cycle would yield a more relaxed test. In addition, dead cycles increase test time.

The control section 205 of multitasking APG 201 controls operation of the multitasking APG, the pin scrambler 240, the T/Fs 250 and PE channels 251, and may consist of a Micro-RAM Address Register 202, a MicroRAM 204, a Loop Counters and Stack register or register-based Loop Counters and Stack 210, Branch Logic 212 and a task selector such as DUT Task Register 280. The control section 205 is a closed loop system that controls itself once set running. In normal operation, the tester 200 user writes an algorithmic pattern that gets loaded by a host computer (not shown) into the MicroRAM 204. The MicroRAM 204 is typically 100 to 200 bits wide and hundreds to tens of thousands of words deep. Some of the bits from the MicroRAM 204 control the program flow of the multitasking APG 201 while other bits from MicroRAM control the registers that generate the data patterns for the DUT 203.

Once the MicroRAM 204 is loaded with the user written program, the multitasking APG 201 is set running by allowing clocks to occur. The MicroRAM Address Register 202 addresses the MicroRAM 204, pointing to the next instruction to be executed. The MicroRAM 204 outputs control bits to the Loop Counters and Stack 210 and to the Branch Logic 212. The Loop Counters and Stack 210 together with the Branch Logic 212 determine the next MicroRAM address to load into the MicroRAM Address Register 202. Loop counters allow instructions to be executed until a count value is reached, then the Branch Logic 212 loads a new MicroRAM Address Register value. The Stack provides a return MicroRAM address when subroutines are executed. The Branch Logic 212 typically allows jumps, subroutine calls, and subroutine returns based on various conditions, including the loop counters previously mentioned. This process of executing a pattern continues until the Branch Logic 212 is instructed to halt by a MicroRAM 204 bit code dedicated to stopping the multitasking APG 201.

While the control section 205 is executing as just described, additional bits from the MicroRAM 204 are simultaneously being sent to other parts of the multitasking APG 201 to algorithmically generate DUT addresses, DUT data, and possibly other functions. FIG. 1 shows a register-based algorithmic Address Generator 220 being driven by MicroRAM 204. The output of the Address Generator 220 drives an Address Topological Scrambler 222 and a Data Generator 230. The Address Topological Scrambler 222 is typically Random Access Memory that provides a topologically true data pattern to the DUT's internal array (not shown) after passing through the DUT's address decoders (not shown), which often scramble the address applied to pins 231 of the DUT 203.

The register-based Data Generator 230 algorithmically generates data patterns for the DUT 203 and can conditionally invert patterns based on the address being sent by Address Generator 220. In addition to algorithmic data, certain DUTs 203 require stored response data patterns as a function of DUT address. An example of this would be a Read-Only-Memory (ROM) where the data pattern is permanently programmed into the DUT 203. Data Buffer Memory 232 is a Random Access Memory that holds stored response data patterns that are delivered as a function of address from Address Generator 220. The test program, via MicroRAM 204 (control connections not shown), can control which data source is sent to the DUT through data multiplexer 234.

The tester 200 shown in FIG. 1 routes the output of the Address Topological Scramblers 222, data multiplexer 234, and other multitasking APG data sources through the Pin Scrambler 240.

Figure 2:
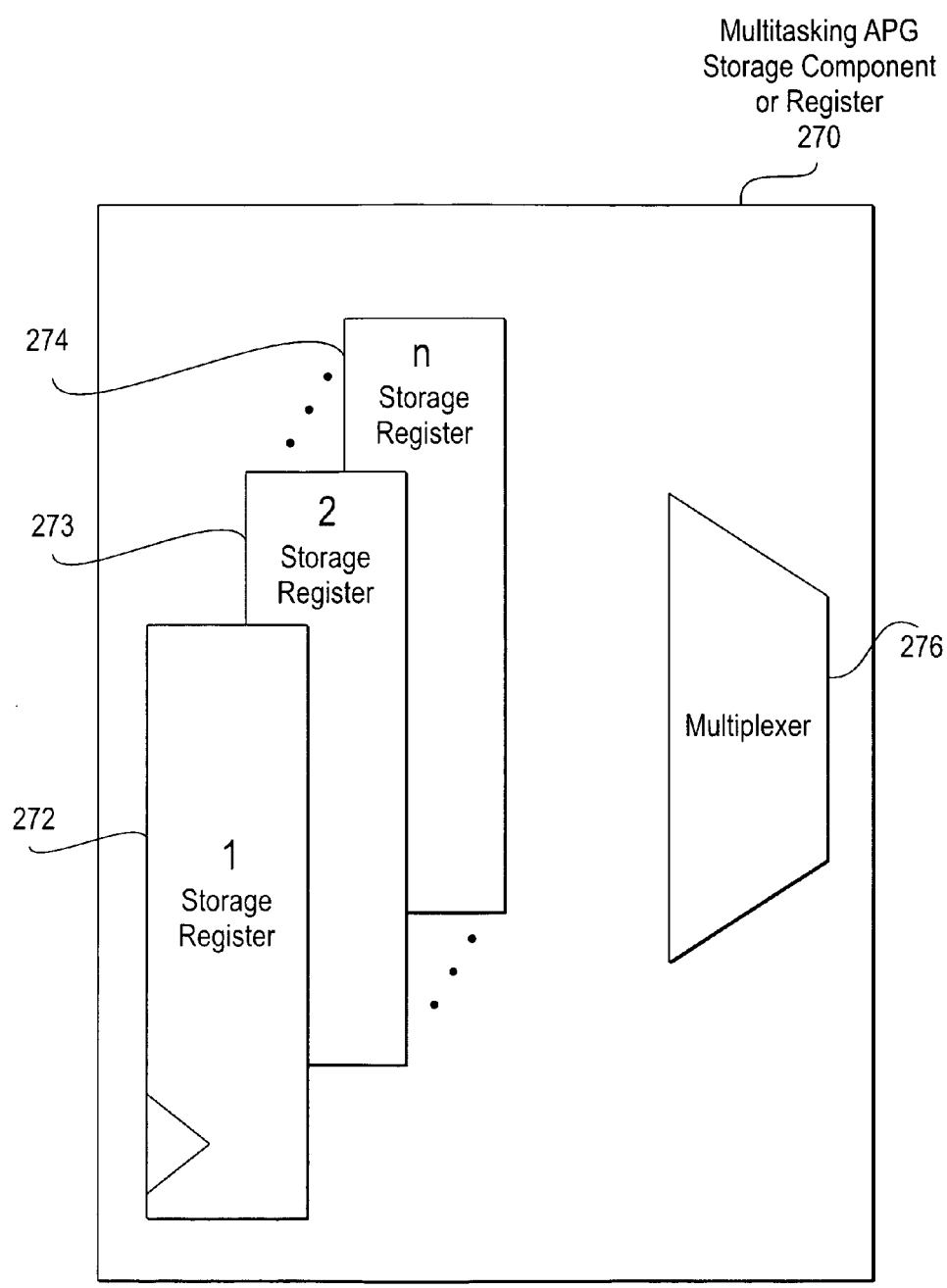
FIG. 2 is a block diagram of a multitasking Algorithmic Pattern Generator Register for use in a tester for testing integrated circuits having a multitasking Algorithmic Pattern Generator according to an embodiment of the present invention.

Storage components or registers for use in the microRAM address register 202, loop counters and stack 210, address generators 220 and data generator 230 will now be described in more detail with reference to FIG. 2. FIG. 2 is a block diagram of an embodiment of a Multitasking APG storage component or Register 270 for use in the multitasking APG 201 of the present invention. In accordance with the present invention, the Multitasking APG Registers 270 are composed of n storage elements or registers, 272, 273, 274, and a selector element or mechanism such as multiplexer 276, fed by registers 272, 273, 274. Each register 272, 273, 274 has a separate clock enable (not shown) synchronized to the multiplexer select. For example, when the multiplexer 276 selects the first input, only the first register's 272 clock is enabled. When the multiplexer selects the nth input, only the nth register's 274 clock is enabled. Thus, registers 272, 273, 274 in the multitasking APG 201 can hold a separate value for each DUT 203.

The multitasking APG 201 of the present invention reduces the hardware cost of a tester 200 for testing small pincount DUTs 203 by providing independent APG capability for slow speed operations. When high speed operations are required, the DUTs can be run in lock step at full APG speed to maximize throughput and provide more stringent test conditions than low speed APGs could provide. That is, in programming the DUTs 203, such as flash memories, the multitasking APG 201 is operated in multitasking mode in which a test pattern is broadcast or written to each DUT independently only as long as necessary to program the DUT. In contrast, conventional testers applied to programming test patterns to all DUTs simultaneously until, the last or slowest DUT had been programmed. Independently, writing a test pattern to each DUT 203 provides a number of beneficial effects. First, there is a more efficient utilization of the multitasking APG 201 resources that maximize tester 200 throughput by enabling the parallel testing of a greater number of DUTs 203 in a given time period. This is because programming typically involves writing a number of patterns to each DUT 203. For example, programming several DUTs 203 in parallel may include writing to each DUT a diagonal pattern over memory cells of the device followed by writing a number of stripes. Thus, for a DUT 203 which programs more rapidly the tester can begin writing a stripe pattern over a previously programmed diagonal pattern rather than wait for the slowest DUT to program the diagonal pattern. Second, because the programming signal or test pattern is applied to each DUT 203 only as long as necessary to program the DUT, each DUT is programmed with an accumulated charge just above a threshold value for the device, and subsequent testing of the DUTs charge or program holding ability will be less likely to produce misleading positive results due to some of the DUTs starting with a higher initial charge.

After all the DUTs 203 have been successfully programmed, the multitasking APG 201 can be operated in lock step at full APG speed to read back the programmed patterns from all the DUTs simultaneously, thereby maximizing throughput.

As noted above, flash memories program at a very slow rate compared to their read cycle. Thus, during programming, the APG typically runs at a slow cycle rate. Taking advantage of this fact, a high speed multitasking APG 201 can be made to look like multiple independent slower APGs by time multiplexing the hardware and directing the output to the appropriate DUT, by time-sharing or slicing up APG time for each DUT or task. For example, an APG that runs at a 20 nanosecond cycle rate could drive each of four DUTs consecutively in successive cycles. The first DUT gets information calculated and launched in the first 20 nanosecond cycle, the second DUT in the second 20 nanosecond cycle, the third DUT in the third 20 nanosecond cycle, and the fourth DUT in the fourth 20 nanosecond cycle. By the time the first DUT gets serviced again, 80 nanoseconds have gone by, so the first DUT sees an effective cycle time of 80 nanoseconds, as does each of the other DUTs, but staggered in time.

This can be seen in FIG. 1, where multitasking APG storage components 270, such as registers, have been appropriately substituted for conventional registers used in prior art APG. The MicroRAM Address Register 202, Loop Counters and Stack 210, Address Generator 220, and Data Generator 230 are all Multitasking APG Registers 270 in a multitasking APG 201. These multitasking APG registers 202, 210, 212, 220, receive controls from a task selector such as DUT Task Register 280 specifying which DUT 203 to service in an active time slice. DUT Task Register 280 gets loaded from a host computer (not shown) via input or computer bus 281 with information including the number of DUTs that will be serviced in multitasking mode.

In one embodiment, the DUT Task Register 280 is essentially a counter, counting from 1 to n where n is the number of DUTs 203 to be serviced. The output of the DUT Task Register 280 can be broadcast as a binary code, a set of n independent enables, or some other format or combination of formats.

Alternatively, the DUT Task Register 280 is an intelligent controller capable of independently examining the cycle rate (period), cycle start time or order in which the DUTs 203 are tested, and the test patterns applied to each DUT. That is each DUT 203 can have its own period (cycle rate) and the beginning of each DUT cycle is not (or does not have to be) staggered in time. The beginning of DUT cycles can occur anywhere in time, irrespective of the timing on the other DUTs. In this embodiment, the DUT Task Register 280 is an intelligent controller capable of looking at the period of the upcoming cycle on each DUT 203 and deciding based on predetermined criteria: (i) which DUT gets to use the multitasking APG 201 in the upcoming cycle, and (ii) when to propagate data through the T/Fs 250 for that particular DUT. The predetermined criteria can include, for example, variable length pipelines to propagate data to the T/Fs 250 that change in real time, and the cycle rate or period of each DUT 203. In one preferred version of this embodiment, the DUT Task Register 280 uses separate enables to the T/Fs 250 rather than a three bit code, thereby enabling data to move independently to each DUT as required.

As in prior art APGs, the multitasking APG 201 includes tremendous amounts of combinatorial logic and RAM to algorithmically calculate patterns. There is also significant RAM in Address Topological Scramblers 222 and Data Buffer Memory 232. None of the combinatorial logic or RAM gets replicated in the multitasking APG 201, thereby saving significant hardware cost.

The DUT Task Register 280 also goes to Pin Scrambler 240 and T/Fs 250. The timed and formatted signals pass through pin electronics channels (P/E 251) for precise voltage conditioning before arriving at the DUT. Pin electronics channels 251 typically include a PE driver for applying a test vector, data, to a pin of DUT 203, a comparator for comparing a DUT output signal with an expected output signal, and an error logic circuit for coupling results of the comparison back to the error capture memory or Error Catch RAM 260.

At this point in APG 200, the signals are separated at a per-DUT 203 pin level. The Pin Scramblers 240 can switch, but the DUT Task Register 280 will instruct the Timing Generators and Formatters 250 to clock and fire only on the active DUT. The Timing Generators and Formatters 250 on the inactive DUTs 203 will not receive enables to latch new data, so they will continue with whatever operations they were doing.

The Error Catch RAM 260 receives the DUT Task Register 280 signals to tell it which part of the error catch memory to use for error logging. The Error Catch RAM 260 is simply a large Random Access Memory which can be subdivided per DUT 203 using the DUT Task Register 280 as a pointer.

The multitasking APG 201 enables the tester 200 to concurrently execute multiple programs on a single pattern generator. While running the programs concurrently, the multitasking operating system time-slices the multitasking APG 201 operations, giving each program the multitasking APG resources for a small increment of time in a continuous loop until the programs finish. The processing for the programs is interleaved in time.

In one embodiment, the multitasking APG 201 hardware or resources is time-sliced up to eight ways, allowing up to eight test programs to run independently and concurrently on a single APG. For example, a 128 pin test site of a tester 200 having a multitasking APG 201 is divided up to eight ways, yielding up to eight independent sixteen-pin DUT test sites. The timing and formatting for each sixteen-pin DUT test site is distributed independently through T/Fs 250.

When the multitasking APG 201 is ready to broadcast a test signal or pattern to a DUT 203, the timing system on the test site associated with that DUT only (and not the other DUTs) is loaded. While that test site's timing system or T/Fs 250 is executing the DUT cycle just loaded, the multitasking APG 201 continues on to the other DUT sites to do the same thing.

The multitasking capability does not cause any dead cycles in pattern execution. Patterns execute just like they would on a conventional APG. Users write all test patterns to the multitasking APG 201 from the host computer (not shown) as they would with a conventional APG and they do not have to manage any of the multitasking hardware. The only thing the user needs to be cognizant of is the number of DUTs 203 to be tested or time domains into which the multitasking APG 201 resources are to be divided, and the maximum cycle time available in multitasking mode.

As the number of DUTs 203 to be tested in parallel or time domains increases in multitasking mode, the maximum cycle rate at a particular DUT or test site decreases. This is because more test sites require more time slices from the multitasking APG 201, meaning it takes more total time to process all the programs. This is a boon for flash memory testing because of the nature of cycle times and site independence required for DUT programming versus DUT array reads.

In one embodiment, the multitasking APG 201 has a maximum cycle rate of 50 MHz, which is a 20 nanosecond period. Table I below illustrates the maximum exemplary cycle rate available on a DUT site versus the number of DUTs being multitasked.

TABLE I

| Multitasking DUTs | Maximum DUT Site Frequency (period) |
| --- | --- |
| 1 | 50 MHz (20 ns) |
| 2 | 25 MHz (40 ns) |
| 4 | 12.5 MHz (80 ns) |
| 8 | 6.25 MHz (160 ns) |
| n | Maximum Frequency/n |

For flash memory programming at slow cycle rates, multitasking can be used to achieve maximum throughput with independent DUT sites. For high speed DUT array reads (meaning higher throughput because of higher speeds), the DUT sites can be run in lock step at up to 50 MHz. Thus, such multitasking APG delivers independent-sixteen-pin DUT sites at up to 6.25 MHz and up to 50 MHz operation in conventional parallel test mode all from one piece of hardware.

Figure 3:
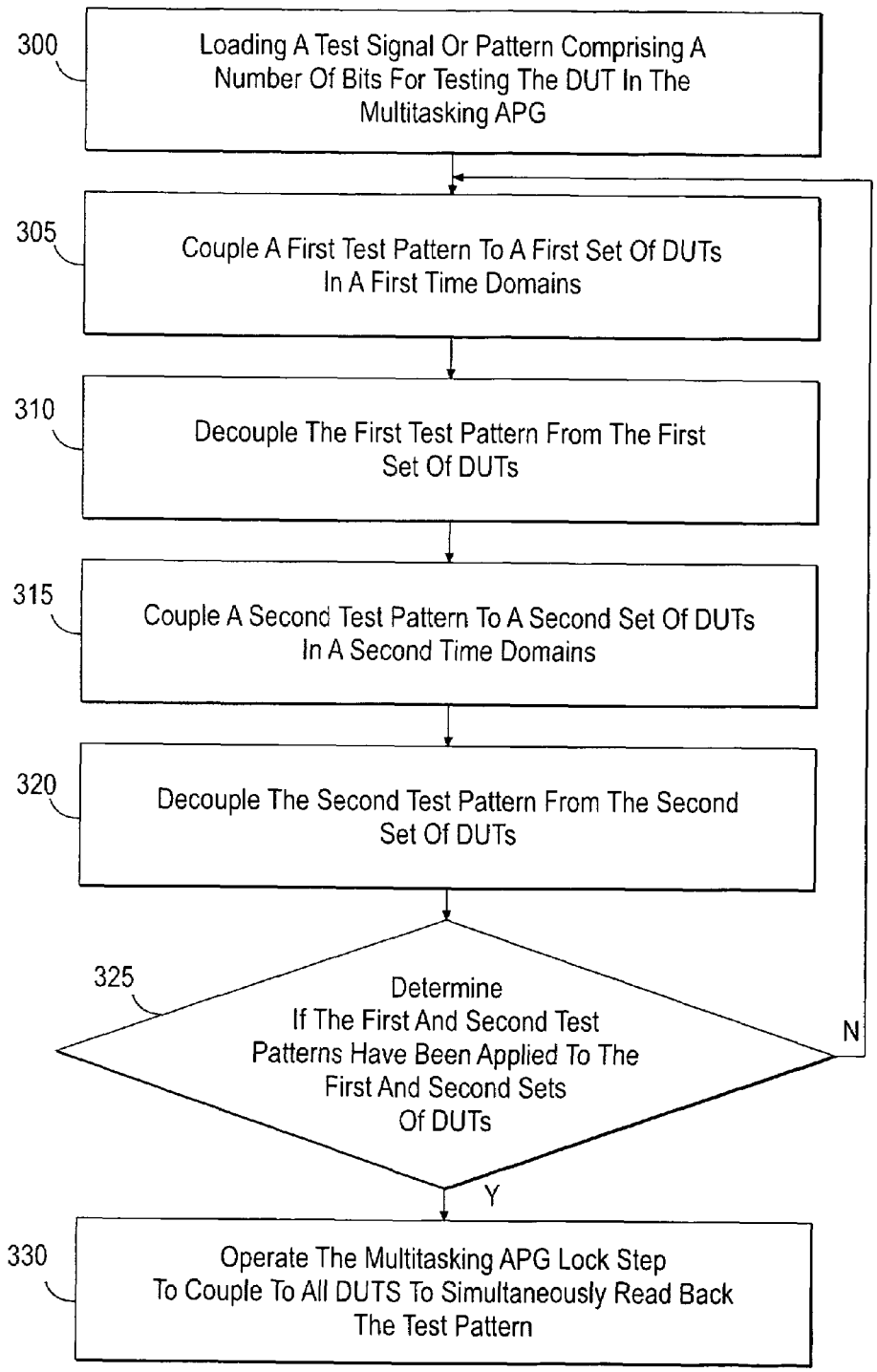
FIG. 3 is a flowchart of a method for operating a tester having a multitasking Algorithmic Pattern Generator according to an embodiment of the present invention.

An embodiment or a process or method for testing first and second DUTs 203 will now be described with reference to FIG. 3. FIG. 3 is a flowchart showing an embodiment of a process for operating a tester having a multitasking APG 201 to write to or program a number of DUTs 203 in parallel in multitasking mode.

Referring to FIG. 3, the process begins by loading a test signal or pattern comprising a number of bits for testing the DUT 203 in the multitasking APG 201 (step 300). This is accomplished by loading from the host computer to the MicroRAM address register 202 and DUT Task Register 280 via a computer bus 282 and computer bus 281 respectively. Generally, this involves loading a test pattern to the MicroRAM address register 202, and information including the number of time domains into which the multitasking APG 201 will be divided, the number and identity of PE channels of DUTs that will be serviced in each time domain to the DUT Task Register 280. Next, a first test pattern is coupled or provided to a first set of at least one of the DUTs 203 in a first one of a number of the time domains (step 305). The test pattern can have a width of from 1 bit to a width equal to the number of PE channels 251 or the pins 231 on the DUT 203. After the first test pattern has been completely provided to the first set of DUTs 203 through the associated T/Fs 250, the first test pattern is decoupled or removed from the first set of DUTs (step 310), and a second test pattern coupled or provided to a second set of DUTs in a second time domain (step 315). Again, after the second test pattern has been completely provided to the first set of DUTs 203 through the associated T/Fs 250, the second test pattern is decoupled or removed from the first set of DUTs (step 320), and steps 305 to 320 repeated until the entire first and second test patterns have been applied or provided to the first and second sets of DUTs (step 325). That is until all DUTs 203 have been completely programmed.

Figure 4:
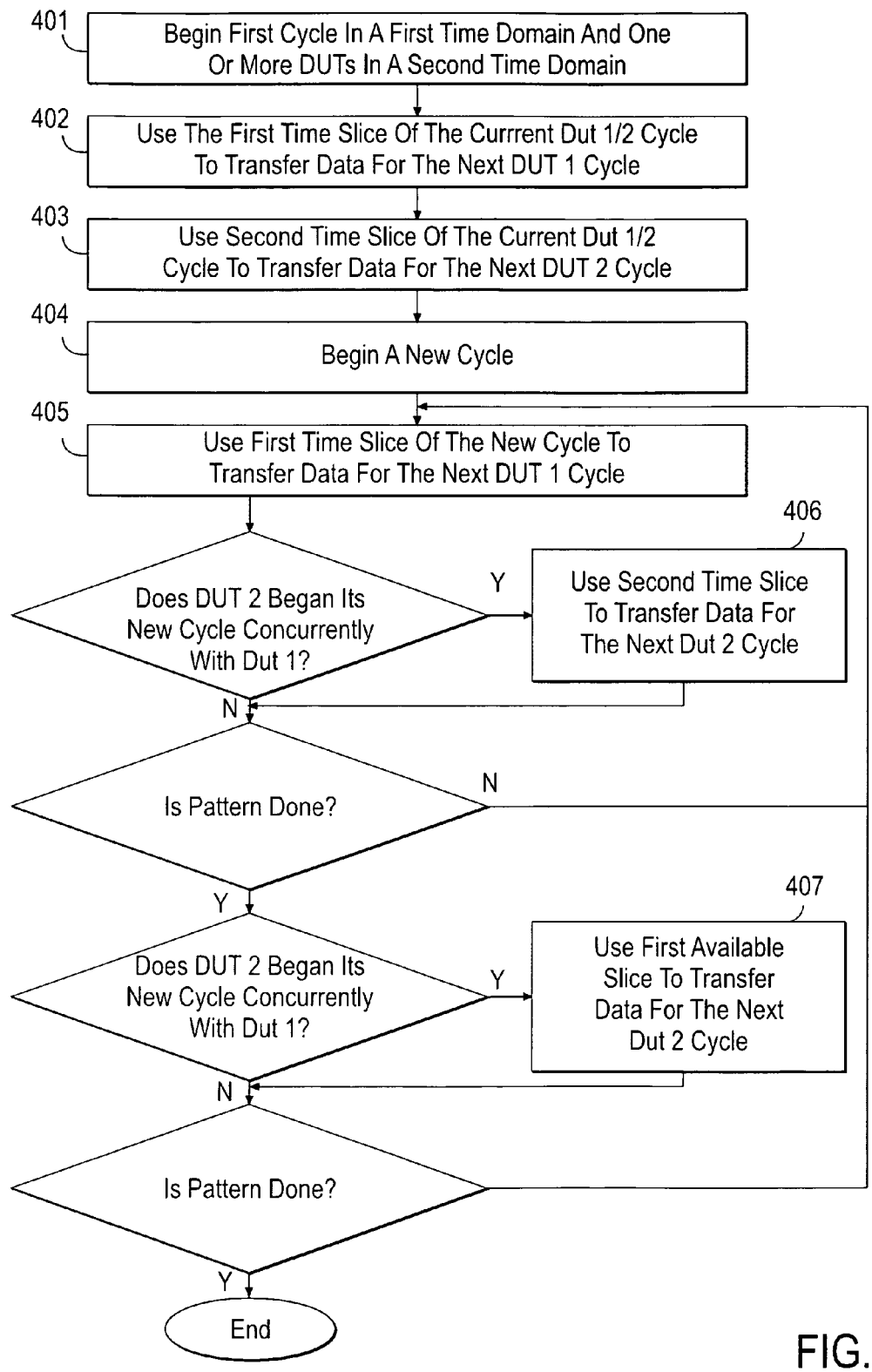
FIG. 4 is a flowchart of another method for operating a tester having a multitasking Algorithmic Pattern Generator according to an embodiment of the present invention.

An embodiment or a process or method for testing first and second DUTs 203 will now be described with reference to FIG. 4. FIG. 4 is a flowchart showing an embodiment of a process for operating a tester having a multitasking APG 201 to write to or program a number of DUTs 203 in parallel in multitasking mode.

Referring to FIG. 4, the process begins with one or more DUTs 203 in a first time domain (DUT 1) and one or more DUTs in a second time domain (DUT 2) both beginning their first cycle (step 401). The first time slice of the current DUT 1/2 cycle is used to transfer data for the next DUT 1 cycle (step 402). All time slices are 20 nS duration. The second time slice of the current DUT 1/2 cycle is used to transfer data for the next DUT 2 cycle (step 403). Next DUT 1 or (DUT 1 and DUT 2) begin a new cycle (step 404). The first time slice of the new cycle is used to transfer data for the next DUT 1 cycle (step 405). If DUT 2 began its new cycle concurrently with DUT 1 then the second time slice is used to transfer data for the next DUT 2 cycle (step 406). If pattern is not done repeat steps 404-406. Else DUT 1 and DUT 2 cycle lengths don't match, and the slice assignments are now based on priority as opposed to DUT number—that is, the controller, DUT Task Register 280, doesn't really look like a counter in this embodiment. If DUT 2 begins a new cycle before DUT 1 then the first available slice (defined in this example as at least 20 nS after the start of the previous slice) is used to transfer data for the next DUT 2 cycle (step 406). If pattern not complete repeat step 407, else go to step 404.

It will be understood that because the DUT Task Register 280 is capable of selecting any of the storage elements 272, 273, 274, to couple to the DUTs 203 in a particular time domain, and of individually enabling each of the DUTs in the time domain, the test patterns written to DUTs in different time domains need not be the same, and the time period of each time domain need not be the same. For example, in one embodiment, the multitasking APG 201 is capable of recognizing when all DUTs 203 in a particular time domain have been programmed and adjusting the period or frequency with which the test pattern is coupled to DUTs in the remaining time domains, thereby maximizing the efficiency of tester 200. In addition, the DUTs 203 or time domains need not be serviced in a regular, or sequential staggered order, but can selecting any of the storage elements 272, 273, 274, to service the DUTs or time domains in any order required based on priorities. For example, where a plurality of DUTs are tested in four time domains having or requiring in upcoming cycles, cycle times of 80 nSec, 100 nSec, 80 nSec and 200 nSec, the DUT Task Register 280 can select the storage elements 272, 273, 274, to service the DUTs in the first time domain, then the third time domain, the second time domain and finally the fourth time domain. Moreover, the order of testing can change with the next upcoming cycle Optionally, when the same test pattern has been written or programmed to all DUTs in different time domains, the method further includes the additional step of operating the multitasking APG 201 lock step to couple to all DUTs to read back the test pattern at the maximum frequency or speed of the multitasking APG (step 330).

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best use the invention and various embodiments with various modifications as are suited to the particular use contemplated. It is intended that the scope of the invention be defined by the claims appended hereto and their equivalents.

I claim:

1. A test apparatus for testing a plurality of semiconductor devices, the apparatus comprising a multitasking Algorithmic Pattern Generator (APG) adapted for coupling to the plurality of semiconductor devices, the multitasking APG being configured to provide a first test pattern to a first one of the plurality of semiconductor devices in a first time domain and a second test pattern to a second one of the plurality of semiconductor devices in a second time domain.

2. A test apparatus according to claim 1, wherein the first test pattern coupled to the first one of the plurality of semiconductor devices in the first time domain is different from the second test pattern coupled to the second one of the plurality of semiconductor devices in the second time domain.

3. A test apparatus according to claim 1, wherein the first time domain comprises a duration different from the second time domain.

4. A test apparatus according to claim 1, wherein the multitasking APG comprises at least one register having a number of storage elements, n, and a selector element through which the number of storage elements are coupled to the plurality of semiconductor devices.

5. A test apparatus according to claim 4, wherein the multitasking APG is adapted for coupling up to n different test patterns to the plurality of semiconductor devices in up to n different time domains.

6. A test apparatus according to claim 4, wherein the multitasking APG comprises a register selected from the group consisting of:
   microRAM address registers;
   loop counters and stack registers;
   address generators; and
   data generators.

7. A test apparatus according to claim 4, wherein the multitasking APG further comprises a DUT task register coupled to the at least one register, the DUT task register adapted for selecting one of the number of storage elements to be coupled to the first one of the plurality of semiconductor devices in the first time domain, and one of the number of storage elements to be coupled to the second one of the plurality of semiconductor devices in the second time domain.

8. A test apparatus according to claim 7, further comprising a plurality of timing and formatting circuits (T/Fs) and pin electronics (PE) channels through which each of the plurality of semiconductor devices is coupled to the number of storage elements, and wherein the DUT task register is adapted to enable only T/Fs and PE channels coupled to the first one of the plurality of semiconductor devices in the first time domain, and T/Fs and PE channels coupled to the second one of the plurality of semiconductor devices in the second time domain.

9. The test apparatus of claim 1 wherein the multitasking APG is configured to provide the first test pattern to a first one of the plurality of semiconductor devices in a first time domain and the second test pattern to a second one of the plurality of semiconductor devices in a second time domain that is distinct from the first time domain.

10. A method of testing a plurality of semiconductor devices using a test apparatus having a multitasking Algorithmic Pattern Generator (APG), the method comprising steps of:
   i. providing at least a portion of a first test pattern from the APG to a first set of at least one of the plurality of semiconductor devices in a first one of a number, n, of time domains, where n is an integer greater than 1;
   ii. removing the first test pattern from the APG from the first one of the plurality of semiconductor devices;
   iii. providing at least a portion of a second test pattern from the APG to a second set of at least one of the plurality of semiconductor devices in a second time domain;
   iv. removing the second test pattern from the APG from the second one of the plurality of semiconductor devices; and
   v. repeating steps i to iv until complete first and second test patterns have been applied to the first and second plurality of semiconductor devices.

11. A method according to claim 10, wherein the step of providing the second test pattern to the second set of the plurality of semiconductor devices comprises the step of providing a second test pattern to the second set of the plurality of semiconductor devices that is different from the first test pattern.

12. A method according to claim 10, wherein the step of providing the second test pattern to the second set of the plurality of semiconductor devices in the second time domain comprises the step of providing the second test pattern to the second set of the plurality of semiconductor devices for a period of time different from a period of time for which the first test pattern is provided to the first set of the plurality of semiconductor devices in the first time domain.

13. A method according to claim 10, wherein the multitasking APG comprises at least one register having at least n storage elements and a selector element though which the storage elements are coupled to the plurality of semiconductor devices, and wherein the step of providing the first test pattern to the first set of the plurality of semiconductor devices comprises the step of selecting one of the n storage elements to be coupled to the first set of the plurality of semiconductor devices in the first time domain.

14. A method according to claim 13, wherein the multitasking APG comprises at least one register having at least n storage elements and a selector element though which the storage elements are coupled to the plurality of semiconductor devices, and wherein the step of providing the second test pattern to the second set of the plurality of semiconductor devices comprises the step of selecting one of the n storage elements to be coupled to the second set of the plurality of semiconductor devices in the second time domain.

15. A method according to claim 10, wherein the test apparatus further comprises a plurality of timing and formatting circuits (T/Fs) and pin electronics (PE) channels though which each of the plurality of semiconductor devices is coupled to the n storage elements, and wherein the step of providing the first test pattern to the first set of the plurality of semiconductor devices comprises the step of enabling only T/Fs and PE channels coupled to the first set of the plurality of semiconductor devices in the first time domain, and the step of providing the second test pattern to the second set of the plurality of semiconductor devices comprises the step of enabling only T/Fs and PE channels coupled to the second set of the plurality of semiconductor devices in the second time domain.

16. A method according to claim 10, further comprising the initial steps of:
   specifying the number, n, of time domains;
   assigning each of the plurality of semiconductor devices to one of n sets of the plurality of semiconductor devices; and
   associating each of the n sets of the plurality of semiconductor devices with one of the n time domains.

17. A semiconductor device tested according to the method of claim 10.

* * * * *